(12) United States Patent
Cayrefourcq et al.

(10) Patent No.: US 7,387,947 B2
(45) Date of Patent: Jun. 17, 2008

(54) METHOD FOR TRANSFERRING A THIN LAYER INCLUDING A CONTROLLED DISTURBANCE OF A CRYSTALLINE STRUCTURE

(75) Inventors: Ian Cayrefourcq, St. Nazaire les Eymes (FR); Carlos Mazure, Bernin (FR); Konstantin Bourdelle, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 71 days.

(21) Appl. No.: 11/305,444

(22) Filed: Dec. 16, 2005

(65) Prior Publication Data

US 2006/0099779 A1  May 11, 2006

Related U.S. Application Data

(63) Continuation of application No. PCT/EP2005/054994, filed on Oct. 4, 2005.

(30) Foreign Application Priority Data

Oct. 4, 2004 (FR) ................... 04 10462

(51) Int. Cl.
*H01L 21/20* (2006.01)
(52) U.S. Cl. ................... 438/458; 257/E21.6
(58) Field of Classification Search ............... 438/455, 438/458
See application file for complete search history.

(56) References Cited

U.S. PATENT DOCUMENTS 6,150,239 A * 11/2000 Goesele et al. ............. 438/458

(Continued)

FOREIGN PATENT DOCUMENTS

WO  WO 2004/008514 A1  1/2004

(Continued)

OTHER PUBLICATIONS

J.P. Colinge, "Silicon-On-Insulator Technology; Materials to VLSI", 2nd Edition by, published by Kluwer Academic Publishers, pp. 50 and 51.

(Continued)

*Primary Examiner*—W. David Coleman
(74) *Attorney, Agent, or Firm*—Winston & Strawn LLP

(57) ABSTRACT

The present invention relates to a method for transferring a thin useful layer from a donor substrate having an ordered crystalline structure to a receiver substrate. The method includes creation of a weakened zone in the donor substrate to define the layer to be transferred from the donor substrate. The crystalline structure of a surface region of the donor substrate is disturbed so as to create a disturbed superficial region within the thickness of the donor substrate, and thus define a disturbance interface between the disturbed superficial region and a subjacent region of the donor substrate for which the crystalline structure remains unchanged. Next, the donor substrate is subjected to a recrystallization annealing in order to at least partial recrystallize of the disturbed region, starting from the crystalline structure of the subjacent region of the donor substrate, and to create a zone of crystalline defects in the plane of the disturbance interface. One or several species are introduced into the thickness of the donor substrate to create the weakened zone, with the species being introduced with introduction parameters that are adjusted to introduce a maximum number of species at the zone of crystalline defects.

20 Claims, 2 Drawing Sheets

U.S. PATENT DOCUMENTS

| | | |
|---|---|---|
| 6,534,381 B2 | 3/2003 | Cheung et al. ............. 438/455 |
| 6,544,862 B1 * | 4/2003 | Bryan ........................ 438/455 |
| 6,548,382 B1 * | 4/2003 | Henley et al. .............. 438/526 |
| 6,756,286 B1 | 6/2004 | Moriceau et al. ........... 438/459 |
| 6,908,828 B2 * | 6/2005 | Letertre et al. ............. 438/406 |
| 6,936,482 B2 | 8/2005 | Auberton-Herve ........... 438/14 |
| 2002/0187619 A1 | 12/2002 | Klienhenz et al. .......... 438/471 |

FOREIGN PATENT DOCUMENTS

| | | |
|---|---|---|
| WO | WO 2004/042779 A2 | 5/2004 |
| WO | WO 2005/004514 A1 | 1/2005 |

OTHER PUBLICATIONS

W.F. van der Weg et al., XP-002315276"Ion Implantation Into Amorphous Solids", Materials Chemistry and Physics, vol. 46, pp. 140-146 (1996).

* cited by examiner

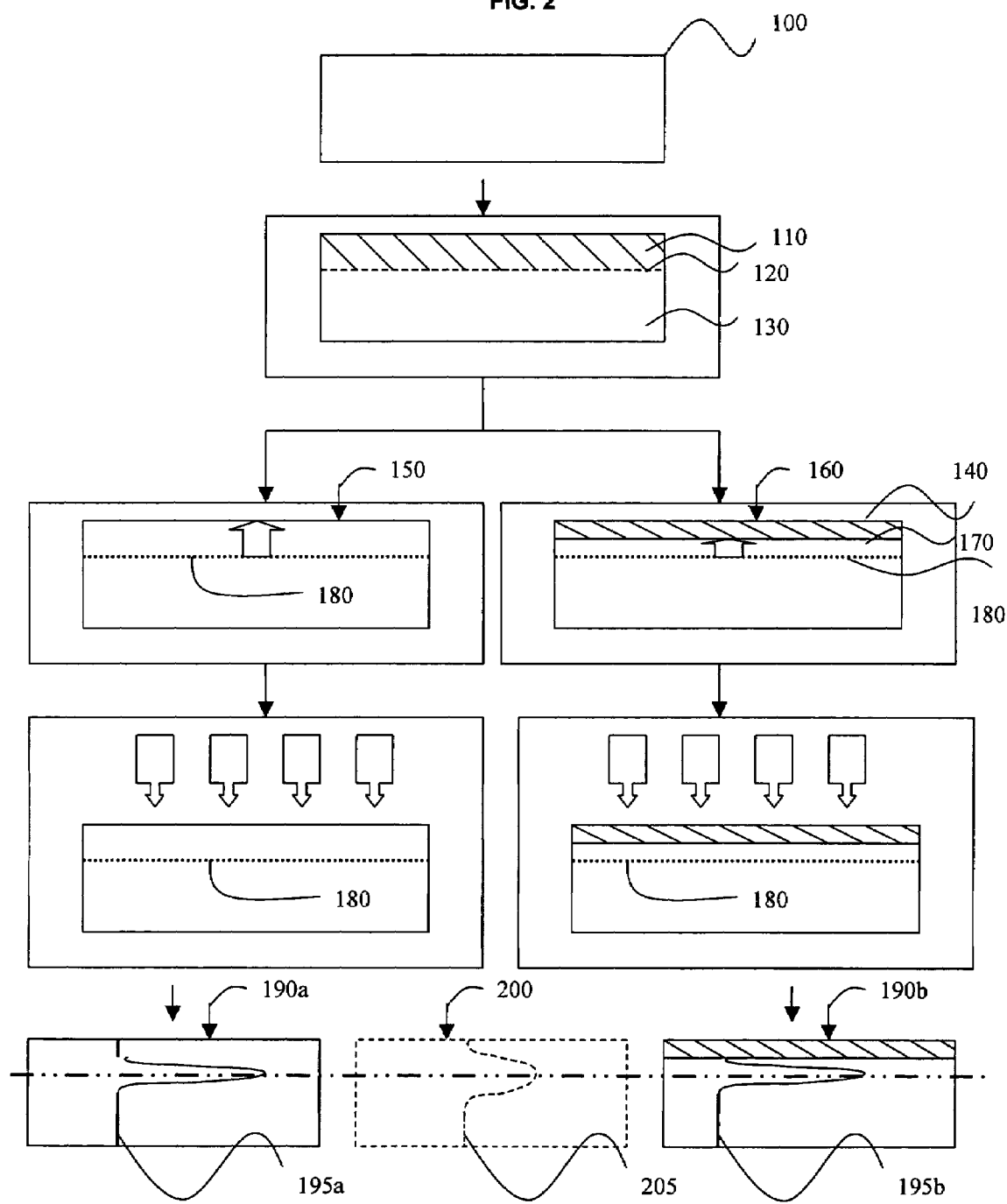

METHOD FOR TRANSFERRING A THIN LAYER INCLUDING A CONTROLLED DISTURBANCE OF A CRYSTALLINE STRUCTURE

CROSS-REFERENCE TO REPLATED APPLICATIONS

This application is a continuation of PCT/EP2005/054994 filed Oct. 4, 2005, the entire content of which is expressly incorporated herein by reference thereto.

BACKGROUND

The present invention is related to the treatment of materials in general, and more particularly substrates for microelectronics, optics or optoelectronics. More precisely, the invention relates to a method for transferring a thin layer from a donor substrate to a receiver substrate, the method including the creation of a weakened zone in the donor substrate to delimit a layer to be transferred in the donor substrate. And as will be seen, one particularly advantageous application of the invention is its use in a SMART-CUT® type layer transfer method. According to one particular aspect, the invention also relates to a transfer method for bonding layers under advantageous conditions.

Transfer methods like those mentioned above are already known. These methods are capable of making multilayer wafers using a step of bonding the donor substrate (that includes the layer to be transferred) and the receiver substrate (onto which the layer will be transferred). The subsequent removal of an upper part of the donor substrate finalizes the transfer and forms the final multilayer wafer, that thus includes the transferred layer (for which the thickness is a few hundred Angstroms to a few microns), the layer formed by the receiver substrate (for which the thickness is typically a few hundred microns) and generally an intermediate layer between the two layers mentioned above (and for which the thickness is typically between a few hundred Angstroms and a few thousand Angstroms).

In order to transfer only a thin layer from the donor substrate to the receiver substrate, it is possible to bond the donor substrate to the receiver substrate, and to eliminate part of the donor substrate opposite the layer to be transferred (for example by grinding and/or chemical etching of the exposed face of the donor substrate). In this case, the donor substrate is entirely consumed by the transfer. It is also possible to create a weakened zone within the thickness of the donor substrate, and to bond the donor substrate to the receiver substrate and make the transfer by fracture of the donor substrate at the weakened zone, before bonding the donor substrate with the receiver substrate.

This weakened zone may be obtained by implantation of an atomic species such as hydrogen and/or rare gases such as helium (in the case of the SMART-CUT® technology) or by the formation of a porous zone (in the case of the ELTRAN® technology). Refer to "Silicon-On-Insulator Technology; Materials to VLSI", $2^{nd}$ Edition by J. P. Colinge, published by Kluwer Academic Publishers, pages 50 and 51 for a more detailed description of these techniques. This type of transfer technique with the creation of a weakened zone defines the general framework of the invention.

Such substrate manufacturing techniques are typically used to form SeOI type multilayer wafers (semi-conductor on insulator), for which the most common form is SOI (silicon on insulator). When manufacturing such wafers, an insulating layer is formed on the face of the donor substrate and/or the face of the receiver substrate that are brought into intimate contact during the bonding step. This insulating layer may be obtained by treatment of one of the substrates (for example by thermal oxidation) or by deposition. The end result will be the buried insulating layer of the SeOI substrate.

More generally, these transfer techniques can be used to create all types of multilayer wafers, with or without an intermediate insulating layer. The invention is thus applicable for manufacturing all types of multilayer wafers, as will be seen later.

Fracture Zone

It is the that the invention is within the framework of transfer techniques based on fracture at a weakened zone. More precisely, the techniques concerned by the invention are techniques in which the weakened zone is created by introducing one or several species (for example hydrogen or helium) into the donor substrate. Note that in the remainder of this text, the term "species" will be used to denote all cases that arise—including cases in which only a single type of species is introduced. This "introduction" of at least one species may be done by implantation. Other techniques may also be envisaged (for example introduction of species by diffusion—particularly by exposing the donor substrate to a plasma, etc.).

It is always important to define the position of the weakened zone obtained by the introduction of species within the thickness of the donor substrate as precisely as possible. The species introduced into the donor substrate are actually distributed within the thickness of this substrate around a depth corresponding to a concentration peak, with a Gaussian distribution (as a first approximation). The fracture that follows will occur (after inputting energy in thermal or mechanical form, etc.), close to this depth corresponding to the concentration peak of the introduced species—this depth defining a maximum weakening of the substrate.

However, it is observed after the fracture that there is a damaged zone on each side of the fracture plane (and therefore on the upper part of the layer that was transferred onto the receiver substrate and onto the exposed face of the removed part of the donor substrate), and this damaged zone may extend over several tens of Angstroms. These damaged zones may be specifically treated (for example by polishing and/or heat treatment) on the final multilayer wafer or on the remainder of the donor substrate for recycling purposes. And it would be commercially useful to eliminate or at least to minimize such treatments.

Recognizing these problems, U.S. Pat. No. 6,756,286 describes methods designed to minimize the thickness of the damaged zone mentioned above, encouraging the positioning of the implanted species around predefined zones of the donor substrate (these zones may be denoted by the term "inclusions"). This document thus discloses how to:

create an inclusion zone in a substrate by depositing a layer of silicon highly doped with boron on the substrate, then covering this layer by depositing a layer containing the layer to be transferred, implanting hydrogen into the donor substrate thus formed, the parameters of the implantation being defined such that a maximum quantity of hydrogen is implanted at the inclusion layer formed by the layer doped with boron. The implanted hydrogen will preferably be located in this layer, due to the chemical affinity.

This technique significantly reduces dispersion of the hydrogen implanted in the thickness of the donor substrate, and after heat treatment of the fracture it is observed that the damaged zones on the surface of the multilayer wafer created and on the residual donor substrate originating from the fracture are much less significant than with a conventional implantation.

PCT published application WO2004/008514 describes a method for the formation of a weakened zone within a monocrystalline donor substrate by hydrogen diffusion. This method is aimed at forming the weakened zone faster than with existing methods for the formation of a weakened zone by diffusion (see page 5 lines 1 to 4 in WO2005/004514).

US published application US2002/0187619 describes a method for trapping metallic contaminants (see page 1 paragraph [0010] in US2002/0187619). This method includes a step of forming a weakened zone by implantation of species (typically hydrogen) into the donor substrate at a first depth. It also includes the formation of a trapping layer at a second depth.

While these methods are somewhat useful, further improvements are desired, and these are provided by the present invention.

Problems Related to Bonding

Layer transfer techniques include a bonding step during which the surfaces of two layers are brought into intimate contact. In all layer transfer techniques, the bonding quality (in particular characterized by the energy with which the two bonded substrates are bonded to each other) will have a direct impact on the final quality of the multilayer wafer obtained. Thus, the flatness of substrates to be bonded, the presence of particles or contaminants on their surfaces to be bonded, and the extent to which these surfaces are hydrophilic have a direct effect on the energy with which the two substrates will be bonded together after being brought into intimate contact.

It has generally been observed that a sufficiently thick intermediate layer called a bonding layer (typically more than 500 Angstroms thick) placed between two monocrystalline substrates to be bonded facilitates bonding and limits the formation of defects (such as blisters) at the contact interface. Refer to the article "Wafer direct bonding: tailoring adhesion between brittle materials" by Andreas Plossl, Gertrud Krauter, Materials Science and Engineering, #25, Nos. 1-2, Mar. 10, 1999 for further details about this bonding step.

When manufacturing SeOI, the insulating layer that is formed on at least one of the two substrates and that will form the buried insulation of the final multilayer wafer, also facilitates and provides a means of limiting bonding defects. This insulating layer can thus itself form a bonding layer. But there are situations in which it is required to obtain a multilayer wafer that does not include a buried insulating layer. More generally, it may be required to use an intermediate bonding layer (for which it will be noted that the addition will always require an additional step in the method). In this type of situation, it is necessary to transfer the layer directly from the donor substrate onto the receiver substrate, without an intermediate layer (regardless of whether or not it is insulating). This is the case for example when it is required to optimize thermal conduction between the transferred layer (in which the microelectronic components are formed) and the receiver substrate so as to dissipate a maximum amount of heat generated by components during their use.

This is also the case when it is required that the final result should be a wafer in which the transferred layer and the receiver substrate have separate properties without it being required to isolate them electrically. For example, wafers are also known that are formed from a layer of monocrystalline Si associated with a polycrystalline SiC support substrate through an electrically conducting interface. These wafers have been developed to offer an inexpensive alternative to monocrystalline SiC substrates, for different wafer diameters. In making this type of wafer, it is often desirable to bond the Si layer onto the receiver substrate directly.

It may also be desirable to combine a transferred layer of silicon directly onto a silicon substrate, the substrate and the layer having different crystalline orientations in order to optimize performances of transistors that could be formed in the corresponding two elements of the multilayer wafer thus formed. In this respect, refer to the publication "Mobility Anisotropy of electron in inversion layers on oxidized silicon surfaces". Physical Review, Vol. 4, N6, September 1971 for a description of the differences in the electrical characteristics of silicon depending on its crystalline orientation. It may also be envisaged to make multilayer wafers comprising a thin layer of silicon or Germanium or Silicon Germanium elastically strained in tension or in compression, directly on a solid silicon substrate.

The examples described above may require direct bonding (in other words without an intermediate layer) of two substrates with different crystalline orientations (or more generally different crystalline characteristics). This type of bonding may be problematic since the crystalline structures of the two substrates to be bonded tend to have a mutual influence after bonding, and a region would be created between the two substrates in which the crystalline structure is disturbed. Direct bonding of the two substrates with different crystalline characteristics (for example different crystalline meshes such that the crystalline lattices of the two substrates cannot be aligned) is the cause of crystalline defects that may propagate in one of the substrates, or in the two substrates. In the context of transferring a thin layer from a donor substrate to a receiver substrate to obtain a multilayer wafer, these defects can make the multilayer wafer obtained unusable for the formation of microelectronic components, particularly when they propagate within the thickness of the thin layer.

Note also that there are two main bonding families, for bonding of two substrates. So-called "hydrophilic" bonding requires cleaning operations, before the bonding operation itself, that could facilitate oxidation of the surfaces to be bonded (cleaning with SC1, SC2 type solutions, etc.). So-called "hydrophobic" bonding requires cleaning with an HF type solution. These types of bonding may undoubtedly be used to make direct bonding such as those mentioned above, but these types of bonding are relatively difficult to implement and may also generate defects that will then have to be treated specifically.

When a hydrophilic or hydrophobic bonding technique is used, some species (for example hydrogen molecules ($H_2$) and/or water molecules ($H_2O$) and/or other contaminants) are formed at the contact interface during the fracture heat treatment that takes place at a temperature of the order of 500° C. for a SMART-CUT® type method, while these species disappear at a temperature of the order of 900° C. The presence of these species ($H_2$ and/or $H_2O$ and/or other contaminants) at the contact interface induces the formation of "void" type defects or "blisters" at the contact interface between the transferred layer and the receiver substrate. Therefore, a special treatment of these defects is necessary.

Thus, it appears that there is a need for allowing direct bonding of substrates (particularly substrates with different characteristics, for example crystalline). This type of bonding would thus be advantageous when implementing layer transfer techniques, particularly techniques based on fracture at a weakened zone that were mentioned above. Thus, improvements in bonding are also desired.

SUMMARY OF THE INVENTION

The present invention now provides a new, simple and high performance solution for reducing the thickness of the damaged zone following a fracture or detachment of a thin useful layer at a weakened zone that was created by the introduction of species into a donor substrate. In addition, the invention also enhances the bonding of the two layers.

In particular, the invention relates to a method for transferring a thin useful layer from a donor substrate having an ordered crystalline structure to a receiver substrate. The donor substrate is typically a semiconductor material and the method includes creation of a weakened zone in the donor substrate to define the thin layer to be transferred from the donor substrate. The crystalline structure of a surface region of the donor substrate is disturbed so as to create a disturbed superficial region within the thickness of the donor substrate, and thus define a disturbance interface between the disturbed superficial region and a subjacent region of the donor substrate for which the crystalline structure remains unchanged. Next, the donor substrate is subjected to a recrystallization annealing in order to at least partial recrystallize of the disturbed region, starting from the crystalline structure of the subjacent region of the donor substrate, and to create a zone of crystalline defects in the plane of the disturbance interface. One or several relatively light species (e.g., hydrogen or helium) species are introduced into the thickness of the donor substrate to create the weakened zone, with these species being introduced with introduction parameters that are adjusted to introduce a maximum number of species at the zone of crystalline defects.

Preferably, the disturbed region is partially recrystallized to order the crystalline structure of the donor substrate in a recrystallized region extending between the zone of crystalline defects and the surface of the donor substrate. Also, the crystalline structure of the surface region of the donor substrate is generally disturbed by being made amorphous or by implantation of a relatively heavy atomic species such as silicon or germanium species.

The method advantageously introduces species by implantation, with at least two different species are implanted. Preferably, one species is hydrogen and the other species is helium.

The parameters of the recrystallization annealing are controlled so as to recrystallize only a part of the thickness of the donor substrate located close to the disturbance interface, while retaining a superficial region of the donor substrate with a disturbed crystalline structure.

The method includes a step of bonding the donor substrate to the receiver substrate, followed by a step of detaching the donor substrate at the weakened zone. For this, the recrystallization annealing is advantageously conducted with parameters that are controlled so as to keep an amorphous superficial region in the donor substrate in order to facilitate the bonding. The bonding is usually direct bonding, not involving any intermediate bonding layer between the donor substrate and the receiver substrate. The method may also include treating one of the donor substrate or the receiver substrate, or both, in order to improve the bond between the donor substrate and the receiver substrate.

In another embodiment, the crystalline structure of the region on the surface of the receiver substrate is disturbed to create a disturbed superficial region within the thickness of the receiver substrate. Again, the crystalline structure of the surface region of the donor substrate may be disturbed by being made amorphous.

BRIEF DESCRIPTION OF THE DRAWINGS

The features and advantages of the invention will become more apparent after reading the following description of the preferred embodiments with reference to the attached drawings given as non-limitative examples and in which.

DETAILED DESCRIPTION OF THE PREFERRED EMBODIMENTS

Figure 1:
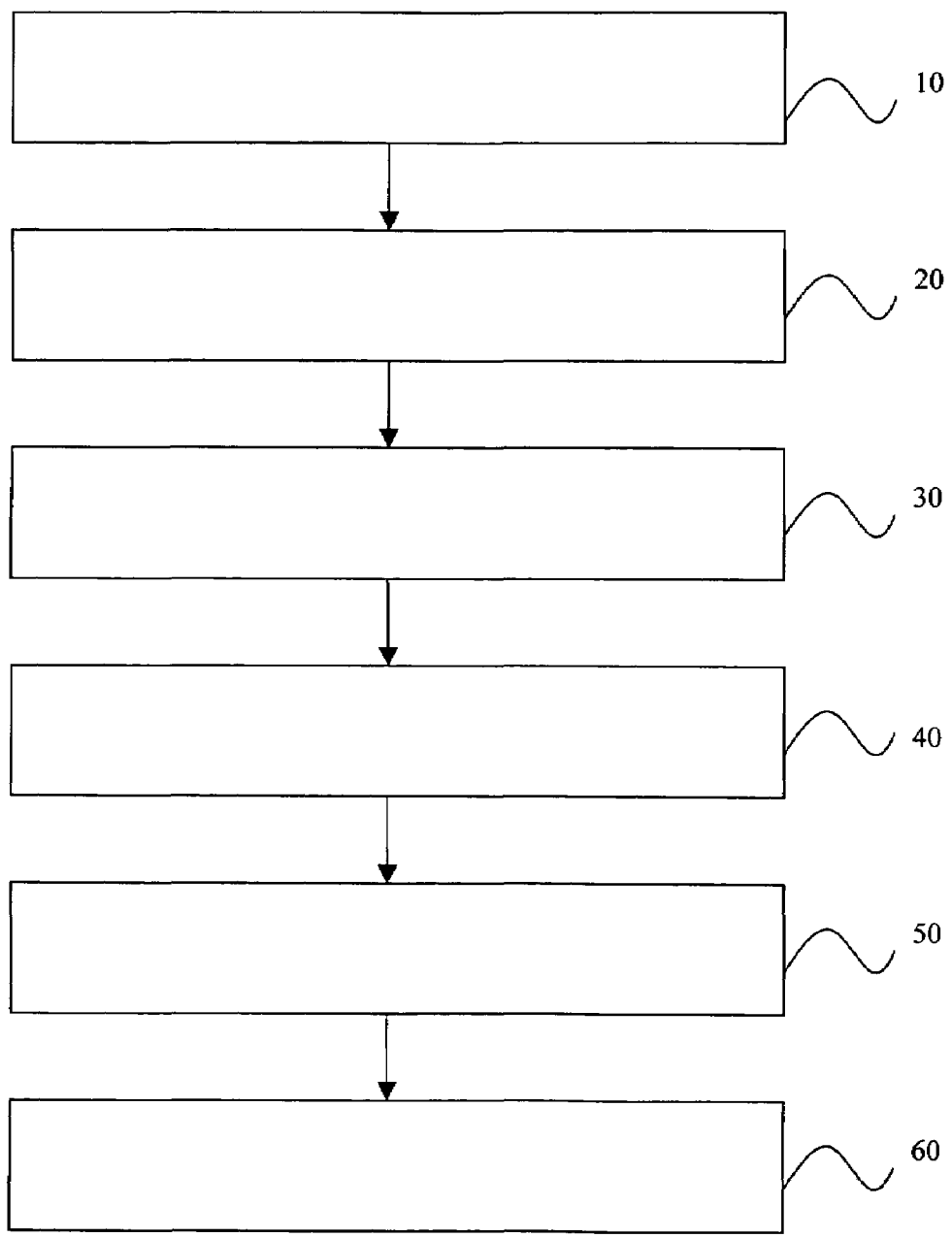
FIG. 1 diagrammatically shows steps according to one possible embodiment of the method according to the invention, FIG. 2 diagrammatically shows the variation of the structure of a donor substrate after different steps of the embodiment illustrated in FIG. 1.

The methods of the present invention now significantly reduce the thickness of the damaged zone following a fracture or detachment of a useful thin layer at a weakened zone that was created by the implantation of species into a donor substrate. These methods also enhance or improve the bonding of the two layers prior to the detachment.

The methods are generally applicable to donor substrates made of semiconductor materials, e.g., silicon, germanium, silicon germanium, or a group III-V material such as GaAs, InP, etc. The donor substrate can have one or more layers of such materials, and the surface layer or region of such substrate is treated by the present methods.

General Appearance—Control of the Weakened Zone

According to one general characteristic and with reference to FIGS. 1 and 2, the method according to the invention is a method for transferring a useful thin layer from a donor substrate having an ordered crystalline structure to a receiver substrate. As noted above, the method includes creation of a weakened zone in the donor substrate to delimit or define a layer to be transferred from the donor substrate, and disturbing the crystalline structure of a surface region of the donor substrate to create a disturbed superficial region within the thickness of the substrate.

In the case of the invention, the method more precisely includes the steps of:

disturbing the crystalline structure of a region on the surface of the donor substrate (step 10 in the embodiment illustrated in FIG. 1), so as to create a disturbed superficial region within the thickness of the donor substrate, so as to define a disturbance interface between the disturbed region and the subjacent region of the donor substrate for which the crystalline structure remains unchanged, submitting the donor substrate to a recrystallization annealing (step 20 in the embodiment illustrated in FIG. 1) in order to cause:

at least partial recrystallization of the disturbed region, starting from the crystalline structure of the subjacent region of the donor substrate, and creation of a zone of crystalline defects in the plane of the disturbance interface, introducing one or several species into the thickness of the donor substrate to create the weakened zone in it (step 30 in the embodiment illustrated in FIG. 1), with the species introduction parameters being adjusted to introduce a maximum number of species at the zone of crystalline defects.

In particular, the disturbance to the crystalline structure of a region on the surface of the donor substrate can be made by implantation of relatively heavy species in the donor substrate (for example species such as Si, Ge). The skilled artisan can conduct routine tests to determine other acceptable relatively heavy species for use in this step. In particular, this "disturbance" corresponds to an amorphization (i.e., transition to an amorphous state) of the region of the donor substrate through which this type of implantation of heavy species takes place. The parameters of such an implantation of heavy species (particularly the energy and implantation doses) are defined to control the implantation depth of these heavy species, which will define a disturbed superficial region within the thickness of the donor substrate. This disturbed region thus typically corresponds to a superficial amorphous region of the donor substrate, while the remainder of the donor substrate retains the original structure of this substrate, which was ordered.

The donor substrate may for example be a substrate 100 made of a monocrystalline material. And creation of a disturbed superficial region 110 thus defines a disturbance interface 120 between the disturbed superficial region 110 and the subjacent region 130 of the substrate that keeps its crystalline structure.

The donor substrate is generally made of a semiconductor material, with the most preferred material being silicon or germanium. The present methods are operable with any semiconductor substrate, including silicon germanium or a group III-V material. In certain situations, the heavy species to be implanted is one that is already present in the semiconductor material so that the material is not contaminated. For example, silicon species can be implanted into a silicon or silicon germanium substrate. In other cases, the heavy species can be different from the substrate, e.g., silicon species can be introduced into a GaAs substrate. Furthermore, when the donor substrate includes one or more layers, and the present methods are used to treat the surface layer or region of such substrate.

The depth of this disturbance interface 120 is defined by implantation parameters for heavy species—that are themselves controlled, as mentioned above, so that the depth of the disturbance interface 120 is also, controlled, as mentioned above. The parameters for implantation of heavy species (and more generally the disturbance) are defined such that the depth of the disturbance interface 120 corresponds to the required depth of the weakened zone within the donor substrate. This required depth is typically equal to or slightly greater than the required thickness for the thin layer to be transferred from the donor substrate onto the receiver substrate. The skilled artisan can determine the appropriate implantation conditions to achieve this result.

Recrystallization (either partial or total) re-orders the crystalline lattice of the donor substrate in a recrystallized region within the disturbed superficial region. This recrystallized region extends between the disturbance interface 120 and the surface 140 of the donor substrate. The recrystallization (that is obtained by a so-called recrystallization annealing) is done based on the "impression" of the crystalline structure closest to the region to be recrystallized. And this closest crystalline structure is the subjacent region 130 of the receiver substrate, for which the structure was not altered by the disturbance treatment.

Depending on the recrystallization annealing parameters (and particularly as a function of the thermal budget that it adds to the wafer), recrystallization will take place within a variable thickness of the region for which the structure was disturbed. It is thus possible to control parameters of this recrystallization annealing to crystallize all or part of the disturbed region. Thus, either a donor substrate 150 for which the disturbed region has been completely recrystallized, or a donor substrate 160 for which only a part 170 of the disturbed region is recrystallized, can be obtained.

It will be seen that this control over recrystallization may advantageously be used to bond the donor substrate with the receiver substrate. The recrystallization annealing thus causes recrystallization of a region of the donor substrate that extends from the disturbance interface to the surface of this substrate, and for which the thickness is controlled.

This recrystallization annealing also causes a second effect, which is advantageously used within the framework of the invention. This annealing causes creation of a zone of crystalline defects 180 (of the dislocation types) in the plane of the disturbance interface 120. This zone extends in the thickness of the donor substrate at a constant depth, along the plane of the disturbance interface 120. This second effect is obtained regardless of whether the recrystallization annealing parameters cause partial or total recrystallization of the disturbed region.

The invention can advantageously be used in the context of a SMART-CUT® type method. A weakened zone can also be created by implantation of one or several species. Unlike species used to disturb the crystalline structure of the donor substrate, the species used for such a weakening implantation are relatively light species e.g., H or an inert gas such as He. The skilled artisan can conduct routine tests to determine other acceptable species and the appropriate implantation conditions for use in this step.

This type of weakening implantation is advantageously done within the framework of the invention. In the case of the invention, before this weakening implantation within the thickness of the donor substrate, there is a zone of crystalline defects 180 after the recrystallization annealing. And the crystalline defects of this zone 180 form traps for lightweight species that will be implanted in the donor substrate in order to create its weakening zone.

This trapping effect is done in practice by two advantageous effects:

Firstly, and as illustrated in FIG. 2, in the case 190a, 190b of the present invention, the implanted lightweight species are more concentrated around their concentration peak (as a function of the depth in the donor substrate) than in case 200 for implantation of lightweight species in a donor substrate that was not previously treated, Furthermore, the depth of maximum implantation of lightweight species in the donor substrate (and therefore the depth of the weakened zone) is accurately controlled because it is defined by the depth of the zone of crystalline defects.

These two effects contribute for providing better control over creation of the weakened zone—and one particular result is that superficial regions produced after fracture at this zone are only slightly disturbed. Thus, the method according to the present invention significantly reduces dispersion of relatively light species introduced into the thickness of the donor substrate for formation of the weakened zone.

Consequently, with the method according to the invention, the standard deviation of the Gaussian distribution 195a, 195b of species introduced into the thickness of the donor substrate is significantly lower than the standard deviation of the Gaussian distribution 205 of lightweight species obtained with methods according to prior art. This is diagrammatically illustrated in FIG. 2. By significantly reducing the dispersion of species introduced into the thickness of the donor substrate, the method according to the invention limits the thickness of the weakened zone. Note that this reduction of the dispersion may be improved by a heat treatment, for example such as a subsequent weakening heat treatment.

Note that documents WO2005/004514 and US2002/0187619 do not concern the problems targeted by the invention, and do not suggest its particular features (and much more generally, do not concern the problem of dispersion of lightweight species introduced into the thickness of the donor substrate). To form the weakened zone, the methods disclosed in documents WO2005/004514 and US2002/0187619 do not include a disturbance step of a region in the donor substrate, or a recrystallization annealing step for part or all of the disturbed region. In document WO2005/004514, the weakened zone is formed by placing the donor substrate in a hydrogen plasma, by performing a first heat treatment at a temperature not exceeding 250° C., and then by performing a second heat treatment at higher temperatures not exceeding 400° C. The weakened zone is formed at the end of the second heat treatment (see page 11, lines 5 to 9 in WO2005/004514). No recrystallization related to formation of the weakened zone is carried out. In US2002/0187619, the weakened zone is formed at a first depth by hydrogen implantation (see page 1, paragraph [0011] in US2002/0187619), and a trapping zone is formed at a second depth to capture metallic contaminants.

Coming back to the invention, note that lightweight species may also be introduced in the donor substrate by other well known techniques other than implantation (e.g., plasma diffusion or other). In any case, the trapping effect mentioned above and its associated advantages remain.

Use of the Invention for Bonding

It has been mentioned that the invention makes it possible to control recrystallization annealing parameters to selectively recrystallize all or part of the superficial region of the donor substrate for which the crystallization structure has been disturbed. It is thus possible to control these parameters such that recrystallization is only partial, and thus to keep a region for which the crystalline structure is disturbed (typically amorphous) on the surface of the donor substrate.

A region located under this disturbed region extends as far as the disturbance interface, and its structure has been re-ordered by the recrystallization annealing. Such a disturbed surface region may be used advantageously for bonding. Such a region can be used for direct bonding of the donor substrate with another substrate (for example the receiver substrate) without the need to insert an insulating layer (or any other bonding layer whatsoever).

The disturbed superficial region (remember that it is typically amorphous) actually forms a region of the donor substrate that itself performs the function that would be performed by a bonding layer. The surface of this superficial region is actually deprived of surface relief by an ordered layer such as a monocrystalline layer—it is thus known that an amorphous layer is capable of performing a "bonding layer" function.

Finally, note that it is also possible to amorphize a superficial region of the receiver substrate before bonding, in order to facilitate direct bonding of the donor substrate and the receiver substrate. A donor substrate and a receiver substrate that each have an amorphized surface could thus be bonded. The presence of an amorphous layer, particularly when it is present on a surface of each of the substrates (donor and receiver) can be used to make contaminants trapped at the contact interface of the substrates disappear more quickly by absorption in the substrates.

Possibility of Treatment of the Receiver Substrate

The received substrate may also be treated to assist in performing the present method. The treatment may be implemented as follows:

in combination with the elements described above concerning the donor substrate, or independently of these elements, in the framework of a method for transferring a thin layer from a donor substrate to the receiver substrate.

In particular, this type of treatment of a receiver substrate having an ordered crystalline structure makes it possible to trap defects that could be generated while bonding the receiver substrate with the donor substrate. Such treatment of the receiver substrate includes creation of a zone of crystalline defects buried in the receiver substrate to create a contaminant trapping zone. This method includes:

disturbing the crystalline structure of a region of the receiver substrate surface, so as to create a disturbed superficial region within the thickness of the receiver substrate, and thus to define a disturbance interface between the disturbed region and the subjacent region of the receiver substrate for which the crystalline structure remains unchanged, submitting the receiver substrate to a recrystallization annealing in order to cause:

at least partial recrystallization of the disturbed region, starting from the crystalline structure of the subjacent region of the receiver substrate, and creation of a zone of crystalline defects in the plane of the disturbance interface (for trapping crystalline defects created during bonding).

As mentioned above, direct bonding of a thin silicon layer with a first orientation on a receiver substrate made of solid silicon with a second crystalline orientation different from the first crystalline orientation (or more generally any crystalline lattices that are not precisely positioned with respect to each other) is the cause of crystalline defects and particularly "through" dislocation type defects.

Creation of a zone of crystalline defects buried in the receiver substrate (by disturbance, then recrystallization as described herein) can prevent defects generated during bonding from propagating into the thickness of the thin layer. Defects generated during bonding are generated and trapped preferentially in the receiver substrate, at this zone of buried crystalline defects.

EXAMPLES

Hybrid Multilayer Wafer by Si—Si Bonding

According to a first particular example embodiment of the invention, the following operations are carried out.

Preparation of a donor substrate, for example made of Silicon. This substrate may have an arbitrary crystalline orientation ((100). (110). . . . ). This substrate may be oxidized at the surface to prepare implantation steps, but in this case the surface oxide thus created will be removed before bonding so that the end result obtained is an Si—Si direct bonding.

Amorphization of a superficial layer by implantation in the donor substrate. The thickness of the amorphized layer corresponds to the thickness of the layer to be transferred.

This amorphization may be obtained by implantation, for example of Si, with sufficient energy to define an implantation concentration peak close to the thickness of the layer to be transferred. For example, the Si implantation energy for a required thickness of the layer to be transferred of the order of 0.1 to 2 microns will be of the order of 50 to 250 keV. More precisely, the implantation depth for an implantation energy of 180 keV will extend to about 0.4 microns. Moreover, the dose of the amorphization implantation is sufficient to amorphize the layer through which the implanted Si passes (dose of the order of $10^{14}$ to $10^{18}$ atoms/cm$^2$ for Si implanted in silicon).

Partial recrystallization annealing and creation of buried crystalline defects at the disturbance interface is then conducted. This annealing is typically done at a temperature of the order of 400° C. to 1000° C. for 30 minutes to 6 hours in a non-oxidizing atmosphere. The exact duration and temperature of annealing will depend on the thickness of the disturbed superficial region and the disturbed thickness to be kept.

A weakening implantation is conducted, for example implanting hydrogen at 60 keV at a dose of $5\times10^{16}$ atoms/cm$^2$ so as to locate the hydrogen concentration peak in the buried zone of crystalline defects.

The receiver substrate is prepared with an arbitrary crystalline orientation preferably different from the orientation of the donor substrate, the receiver substrate itself possibly comprising an amorphized zone on the surface to further facilitate bonding with the receiver substrate, A pre-treatment step (step 40 in the method illustrated in FIG. 1) is optionally conducted on the donor substrate and/or the receiver substrate to improve bonding between the donor substrate and the receiver substrate. A typical plasma treatment or heat treatment is conducted at 350° C. for about two hours, or an annealing heat treatment in order to reinforce the bonding interface as described in document WO2005/004233, or any other treatment known according to those skilled in the art in order to improve bonding between the donor substrate and the receiver substrate, The donor substrate is directly bonded onto the receiver substrate by the use of one of more amorphous surface layers to be bonded (step 50 in the method illustrated in FIG. 1).

A fracture heat treatment (step 60 in the method illustrated in FIG. 1) is conducted at about 400° C. to 600° C. for 2 to 8 hours to make the fracture at the weakened zone, and obtain a multilayer wafer including the receiver substrate and the layer transferred from the donor substrate, The multilayer wafer thus obtained is finished. This finishing is limited to light finishing since the zone damaged during the fracture only covers a small thickness on the surface of the wafer. For example, this finishing may be done by rapid annealing (RTA) or a sacrificial oxidation and/or polishing. Finishing in the form of annealing could entirely recrystallize the amorphized region(s)—particularly if done at a high temperature (more than 1000° C).

Total Recrystallization

The entire disturbed superficial region can be recrystallized if required (typically amorphized). In this case, the recrystallization annealing parameters are defined so as to lead to total recrystallization of the amorphous layer.

In this case, the buried zone of crystalline defects resulting from the recrystallization annealing will be particularly well marked, because this annealing will have a very marked effect on creation of these defects. For example, the recrystallization annealing may consist of combining a first medium temperature recrystallization step at about 600° C. for about 4 hours, followed by a second annealing at a higher temperature (about 1000° C.) also for about 4 hours so as to develop trapping dislocations buried in the donor substrate.

It may be particularly interesting in this case to plan to amorphize a surface region of the receiver substrate before it is bonded with the donor substrate, in order to facilitate this bonding.

Donor Substrate Made of, or Containing, Germanium

In this case, it can be decided to implant Germanium in the donor substrate to create the disturbed superficial region in it.

The skilled artisan will appreciate that some steps of the method can be done in a different order. For example, in one embodiment, the steps for formation of the weakened zone (steps 10, 20 and 30 in the embodiment illustrated in FIG. 1) are done after bonding (step 50 in the method illustrated in FIG. 1) of the donor substrate onto the receiver substrate and before the fracture step 60 (with reference to the embodiment illustrated in FIG. 1), the steps in the method according to the invention are then done in the following order (40-50-10-20-30-60).

What is claimed is:

1. A method for transferring a thin useful layer from a donor substrate having an ordered crystalline structure to a receiver substrate, the method including creation of a weakened zone in the donor substrate to define the thin layer to be transferred from the donor substrate, wherein the method comprises:

disturbing the crystalline structure of a surface region of the donor substrate so as to create a disturbed superficial region within the thickness of the donor substrate, and thus define a disturbance interface between the disturbed superficial region and a subjacent region of the donor substrate for which the crystalline structure remains unchanged, subjecting the donor substrate to a recrystallization annealing in order to:

at least partially recrystallize the disturbed region, starting from the crystalline structure of the subjacent region of the donor substrate, and create a zone of crystalline defects in the plane of the disturbance interface; and introducing one or several species into the thickness of the donor substrate to create the weakened zone, with the species being introduced with introduction parameters that are adjusted to introduce a maximum number of species at the weakened zone at a depth that corresponds to that of the zone of crystalline defects.

2. The method of claim 1, wherein the disturbed region is partially recrystallized to order the crystalline structure of the donor substrate in a recrystallized region extending between the zone of crystalline defects and the surface of the donor substrate.

3. The method of claim 1, wherein the crystalline structure of the surface region of the donor substrate is disturbed by being made amorphous.

4. The method of claim 1, wherein the donor substrate comprises a semiconductor material and the crystalline structure of the surface region of the donor substrate is disturbed by implantation of a relatively heavy species.

5. The method of claim 1, wherein the wherein the donor substrate comprises a semiconductor material and the weakened zone is created by implanting relatively light species.

6. The method of claim 1, wherein the parameters of the recrystallization annealing are controlled so as to recrystallize only a part of the thickness of the donor substrate located close to the disturbance interface, while retaining a superficial region of the donor substrate with a disturbed crystalline structure.

7. The method of claim 1, wherein the method includes a step of bonding the donor substrate to the receiver substrate, followed by a step of detaching the donor substrate at the weakened zone.

8. The method of claim 1, which further comprises disturbing the crystalline structure of the region on the surface of the receiver substrate to create a disturbed superficial region within the thickness of the receiver substrate.

9. The method of claim 4, wherein the donor substrate comprises silicon, germanium, silicon germanium, or a group III-V material and the relatively heavy species is a silicon or germanium species.

10. The method of claim 9, wherein the species introduced into the donor substrate is one that is already present in the donor material to avoid contamination of the donor substrate.

11. The method of claim 5, wherein at least two different species are implanted.

12. The method of claim 11, wherein one species is hydrogen and the other species is helium.

13. The method of claim 7, wherein the recrystallization annealing is conducted with parameters that are controlled so as to keep an amorphous superficial region in the donor substrate in order to facilitate the bonding.

14. The method of claim 7, wherein the bonding is direct bonding, not involving any intermediate bonding layer between the donor substrate and the receiver substrate.

15. The method of claim 7, which further comprises treating one of the donor substrate or the receiver substrate, or both, in order to improve the bond between the donor substrate and the receiver substrate.

16. The method of claim 8, wherein the crystalline structure of the surface region of the donor substrate is disturbed by being made amorphous.

17. The method of claim 8, wherein the donor substrate comprises a semiconductor material and the crystalline structure of the surface region of the donor substrate is disturbed by implantation of a relatively heavy species.

18. The method of claim 17, wherein the donor substrate comprises silicon, germanium, silicon germanium, or a group III-V material and the relatively heavy species is a silicon or germanium species.

19. A method for transferring a thin useful layer from a donor substrate having an ordered crystalline structure to a receiver substrate, wherein the method comprises:

disturbing the crystalline structure of a surface region of the donor substrate by implantation of relatively heavy species so as to create a disturbed superficial region within the thickness of the donor substrate, and thus define a disturbance interface between the disturbed superficial region and a subjacent region of the donor substrate for which the crystalline structure remains unchanged, subjecting the donor substrate to a recrystallization annealing in order to:

at least partially recrystallize the disturbed region, starting from the crystalline structure of the subjacent region of the donor substrate, and create a zone of crystalline defects in the plane of the disturbance interface; and introducing one or several species into the thickness of the donor substrate to create the weakened zone, with the species being introduced with introduction parameters that are adjusted to introduce a maximum number of species at the weakened zone at a depth that corresponds to that of the zone of crystalline defects;

wherein recrystallization annealing occurs after disturbing the crystalline structure but before introducing the one or more species.

20. The method of claim 19 wherein the depth of the disturbance interface is equal to or slightly greater than the depth of the weakened zone that defines the thin layer to be transferred from the donor substrate onto the receiver substrate.

* * * * *